United States Patent
Pakriswamy

(10) Patent No.: US 6,462,600 B2
(45) Date of Patent: *Oct. 8, 2002

(54) READ-HEAD PREAMPLIFIER HAVING INTERNAL OFFSET COMPENSATION

(75) Inventor: Elango Pakriswamy, Santa Clara, CA (US)

(73) Assignee: STMicroelectronics, Inc., Carrollton, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/318,320

(22) Filed: May 25, 1999

(65) Prior Publication Data

US 2001/0043108 A1 Nov. 22, 2001

(51) Int. Cl.[7] .................................................. H03L 5/00
(52) U.S. Cl. .......................... 327/307; 330/259; 360/67
(58) Field of Search .............................. 327/307; 330/9, 330/149, 259, 304; 360/46, 67

(56) References Cited

U.S. PATENT DOCUMENTS

| | | | | |
|---|---|---|---|---|
| 4,395,681 A | * | 7/1983 | Hornung et al. | 330/259 |
| 5,636,048 A | * | 6/1997 | Kogure et al. | 359/189 |
| 5,798,664 A | * | 8/1998 | Nogahori et al. | 327/307 |
| 5,955,921 A | * | 9/1999 | Ide et al. | 330/254 |
| 6,061,192 A | * | 5/2000 | Ogiwara | 360/46 |

* cited by examiner

*Primary Examiner*—Tuan T. Lam
(74) *Attorney, Agent, or Firm*—Lisa K. Jorgenson; Bryan A. Santarelli

(57) ABSTRACT

A circuit includes a differential amplifier that generates a differential offset signal on its output terminals. The circuit also includes an offset compensator that has input terminals respectively coupled to the amplifier output terminals and a compensation terminal coupled to the differential amplifier. The compensator maintains the differential offset signal at a predetermined value, for example 0 V. When used in an integrated read-head preamplifier, such a circuit compensates for the nonzero head bias voltage, i.e., the preamplifier input offset voltage, without using a component that is external to the integrated preamplifier circuit.

45 Claims, 5 Drawing Sheets

READ-HEAD PREAMPLIFIER HAVING INTERNAL OFFSET COMPENSATION

TECHNICAL FIELD

The invention relates generally to integrated circuits (ICs), and more particularly to an integrated read-head preamplifier circuit having an amplifier and an on-board offset compensator for the amplifier. In one embodiment, the amplifier is a differential amplifier.

BACKGROUND

To reduce the pin count and manufacturing costs of an IC and to reduce the assembly costs of products incorporating the IC, the IC designer typically designs the IC to require as few external components as possible. For example, suppose that the IC includes an amplifier that requires an external compensation capacitor. To accommodate the capacitor, the IC typically needs at least one pin that is "dedicated" to the capacitor. Unfortunately, in addition to increasing the IC's pin count, this dedicated pin often increases the package size and manufacturing complexity, and thus the manufacturing costs, of the IC. Furthermore, if the IC is installed on a circuit board of a computer disk drive, the external capacitor often increases the component count and assembly complexity of the circuit board, and thus often increases the disk drive's component and assembly costs.

FIG. 1 is a schematic block diagram of a read circuit 8 including a magneto-resistive read head 10 and an integrated preamplifier circuit 12, which requires an external compensation capacitor 14. The head 10 senses data written on a magnetic medium such as a magnetic disk (FIG. 8) and generates a read signal based on the values of the sensed data. The circuit 12 includes a bias circuit 16 for providing a bias signal to the head 10, an amplifier 18 for amplifying the read signal from the head 10, and a driver circuit 20 for interfacing the amplified read signal to other circuitry (FIG. 8). As discussed below in conjunction with FIGS. 2 and 3, the external capacitor 14 allows the amplifier 18 to generate a balanced output signal in spite of the unbalanced bias voltage it receives from the head 10.

FIG. 2 is schematic diagram of a circuit model for the read head 10 of FIG. 1. The head 10 includes head input/output terminals 22 and 24, and is modeled as a serial combination of an AC (nonzero frequency) voltage source 26 and equal-valued resistors 28 and 30, and a capacitor 32 in parallel with the serial combination. In one embodiment of the head 10, the resistors 28 and 30 each have a value of 25 ohms (Ω) and the capacitor 32 has a value of 2 picofarads (pF).

In operation, the head 10 generates a bias voltage in response to a DC (zero or near-zero frequency) bias current from the bias circuit 16 (FIG. 1). The bias current flows through the serial combination of the source 26 and resistors 28 and 30 and charges the capacitor 32 to a corresponding bias voltage that appears across the head terminals 22 and 24. As the magnetic storage medium (FIG. 8) moves by the head 10, the polarities of the stored magnetic fields—these fields represent the stored data—cause the voltage source 26 to generate a corresponding AC voltage Vread, which represents the data stored on the magnetic medium. The data is primarily represented by the Vread frequencies that are greater than or equal to approximately 1 Megahertz (MHz). Therefore, to reduce signal noise, the read channel (FIG. 8) coupled to the output of the preamplifier 12 typically filters out all frequencies below approximately 1 MHz. Furthermore, because the values of the resistors 28 and 30 are relatively small and the input impedance of the amplifier 18 is relatively large, one can approximate that the full value of Vread appears across the terminals 22 and 24, and is thus superimposed on the DC head bias voltage. But although Vread is superimposed on the head bias voltage, one can easily recover Vread by removing the head bias voltage from the combined signal as discussed below.

FIG. 3 is a schematic diagram of a known differential version of the integrated preamplifier circuit 12 of FIG. 1.

The bias circuit 16 includes a conventional current source 40 for generating a bias current for the head 10, and includes a feedback circuit 42 for centering the head bias voltage around a reference voltage such as 0 Volts (V), i.e., ground. The feedback circuit 42 includes bias elements such as resistors 44 and 46, which are in parallel with the head 10 and which define a sense node 48. A high-gain differential amplifier such as an operational amplifier 50 compares the sense voltage at the sense node 48 with ground and controls the conductivity of a transistor 52 to maintain the sense voltage substantially equal to 0 V. The transistor 52 has its source coupled to a resistor 54, and thus is configured as a common source stage. A resistor 56 and a capacitor 58 are coupled to the output of the amplifier 50 and set the dominant pole of the feedback circuit 42. In one embodiment of the circuit 16, the current source 40 generates a bias current of approximately 5 milliamperes (mA), the resistors 44 and 46 each have a value of approximately 5 kiloohm (KΩ), the transistor 52 is an NMOS transistor, the resistor 54 has a value of approximately 500Ω, the resistor 56 has a value of approximately 500 KΩ, the capacitor 58 has a value of approximately 20 pF, and the dominant pole is approximately 16 kilohertz (KHz).

The pseudo-differential cascoded amplifier 18 differentially receives the bias voltage and Vread from the head 10 (FIG. 2) on input terminals 60 and 62. As discussed below, the amplifier 18 effectively filters out the bias voltage and amplifies only Vread to generate an intermediate differential read signal on output terminals 64 and 66. The amplifier 18 includes current sources 68 and 70, input transistors 72 and 74, cascode transistors 76 and 78, loads such as resistors 80 and 82, and compensation terminals 84 and 86. The cascode transistors 76 and 78 receive a bias voltage Vbias, which is generated by a conventional bias circuit (not shown). Because the amplifier 18 includes the two separate current sources 68 and 70 instead of a single, shared current source, the amplifier 18 is not a true differential amplifier; hence the name "pseudo-differential." But as discussed below, having separate current sources allows the amplifier 18 to effectively filter the DC head bias voltage from the input signal, and the compensation capacitor 14 allows the amplifier 18 to differentially amplify Vread. In one embodiment of the amplifier 18, the current sources 68 and 70 each generate a respective current of approximately 3 mA, the transistors 72, 74, 76, and 78 are bipolar NPN transistors, the resistors 80 and 82 each have a value of approximately 1.6 KΩ, and the external capacitor 14 has a value of approximately 0.01 microfarads ($\mu$F).

Still referring to FIG. 3, the output driver circuit 20 receives the intermediate differential read signal from the amplifier output terminals 64 and 66 and generates an output differential read signal on output terminals 88 and 90. The drive circuit 20 includes drive transistors 92 and 94 and respective current sources 96 and 98. In one embodiment of the drive circuit 20, the transistors 92 and 94 are bipolar NPN transistors and the current sources 96 and 98 each generate a respective current of approximately 1 mA.

Referring to FIGS. 2 and 3, the steady-state and data-read operations of the preamplifier 12 are discussed. "Steady-state" refers to the preamplifier operation in response to input signals having low and zero frequencies (e.g. head-bias voltage), and "data-read" refers to the preamplifier operation in response to input signals having higher frequencies (e.g. Vread). For example, using the component and current-source values given above for the head 10 and the preamplifier 12, steady-state corresponds to frequencies less than or equal to approximately 16 KHz, and data-read corresponds to frequencies greater than or equal to approximately 16 KHz, particularly frequencies greater than or equal to approximately 1 MHz. Furthermore, because the preamplifier 12 often receives steady-state and data-read frequencies simultaneously, these operational modes usually occur simultaneously. But for clarity of explanation, these modes are discussed separately.

During steady-state operation, the current source 40 generates a bias current that flows through the parallel combination of the resistors 28, 30, 44, and 46 and on through the transistor 52 and the resistor 54. The bias current generates the bias voltage across the head 10 and thus across the amplifier input terminals 60 and 62. For example, using the current and resistor values given above, this bias voltage is approximately 250 millivolts (mV). Because the feedback circuit 42 maintains the sense node 48 at substantially 0 V and because the bias resistors 44 and 46, have substantially the same resistance, the bias voltage is centered around ground. Therefore, in the this example, the bias voltage on the input terminal 60 is approximately +125 mV with respect to ground, and the bias voltage on the input terminal 62 is approximately −125 mV with respect to ground. These unequal voltages generate a nonzero differential bias voltage, i.e., a nonzero differential offset voltage, across the amplifier input terminals 60 and 62. But even though these input voltages are unequal, the current sources 68 and 70 sink substantially identical currents through the respective branches of the amplifier 18. Therefore, because the values of the load resistors 80 and 82 are substantially equal the steady-state output voltages on the output terminals 64 and 66 are also substantially equal. (If the amplifier 18 were a true differential amplifier, then the steady-state output voltages would be unequal, and the amplifier 18 would operate improperly during data-read operation.) In response to the substantially equal voltages on the terminals 64 and 66, the output driver 20 generates substantially equal voltages on its output terminals 88 and 90 in a conventional manner. Thus, the driver 20 generates a differential output offset voltage of approximately 0 V. As is known, a 0 V differential output offset is typically desired because it allows the amplified AC signal, here amplified Vread, to have a maximum symmetrical swing in both the positive and negative directions.

During data-read operation, the capacitor 14 causes the amplifier 18 to operate as a true differential amplifier with respect to Vread, which the head 10 generates across the amplifier input terminals 60 and 62. Therefore, the amplifier 18 generates an intermediate differential read signal across the output terminals 64 and 66 in a conventional manner. In response to this intermediate differential read signal, the driver circuit 20 generates an output differential read signal across the terminals 88 and 90 in a conventional manner. As stated above, because the steady-state output offset voltage across the terminals 88 and 90 is substantially 0 V, driver circuit 20 is less likely to clip the output differential read signal.

More specifically, at the data-read frequencies, the external compensation capacitor 14 acts like a short circuit that effectively couples together the emitters of the transistors 72 and 74. That is, the compensation capacitor 14 has a negligible impedance at frequencies above the zero formed by the capacitor 14 and the impedance it "sees" at the compensation terminals 84 and 86. Thus, the value of the capacitor 14 is typically selected so that this zero is lower than the expected frequencies of Vread. In one embodiment of the amplifier 18, the zero set by the capacitor 14 is approximately 160 KHz.

Unfortunately, because the emitters of the transistors 72 and 74 exhibit relatively low impedances—typically on the order of 10–100 Σ—the capacitor 14 must be relatively large to set the zero at the desired frequency, and is typically too large to be integrated on the same die as the preamplifier 12. Therefore, the capacitor 14 is typically a discrete capacitor that is external to the preamplifier 12.

SUMMARY OF THE INVENTION

In one aspect of the invention, a circuit includes a differential amplifier that generates a differential offset signal on its output terminals. The circuit also includes an offset compensator that has input terminals respectively coupled to the amplifier output terminals and a compensation terminal coupled to the differential amplifier.

The compensator maintains the differential offset signal at a predetermined value, for example 0 V.

When used in a read-head preamplifier, such a circuit compensates for the nonzero head bias voltage, i.e., the nonzero amplifier input offset voltage, without using a component that is external to the integrated preamplifier circuit.

DESCRIPTION OF THE INVENTION

Figure 1:
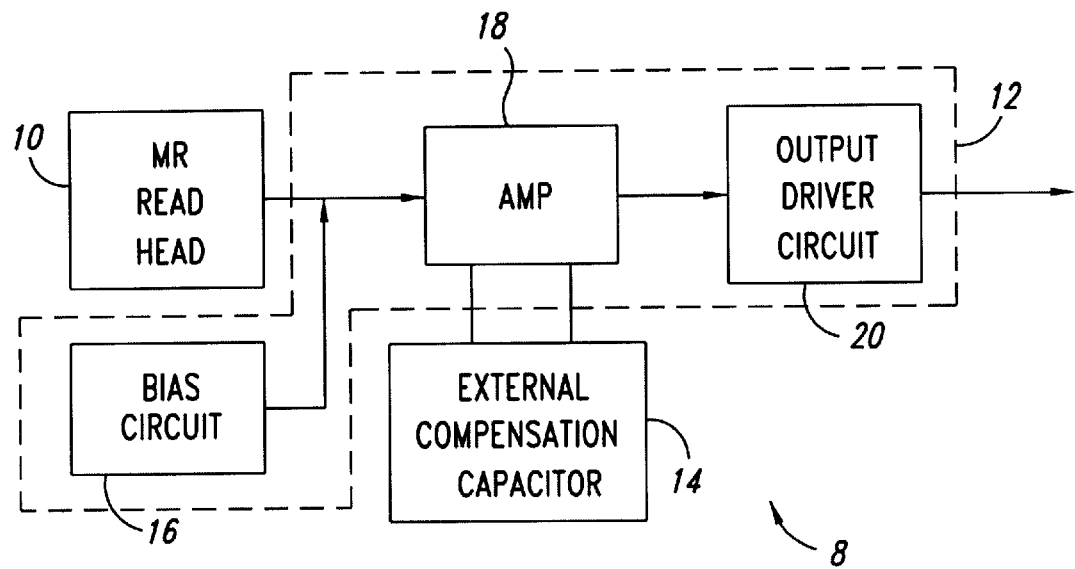
FIG. 1 is a block diagram of a read circuit that includes a conventional read head and a conventional preamplifier.
Figure 2:
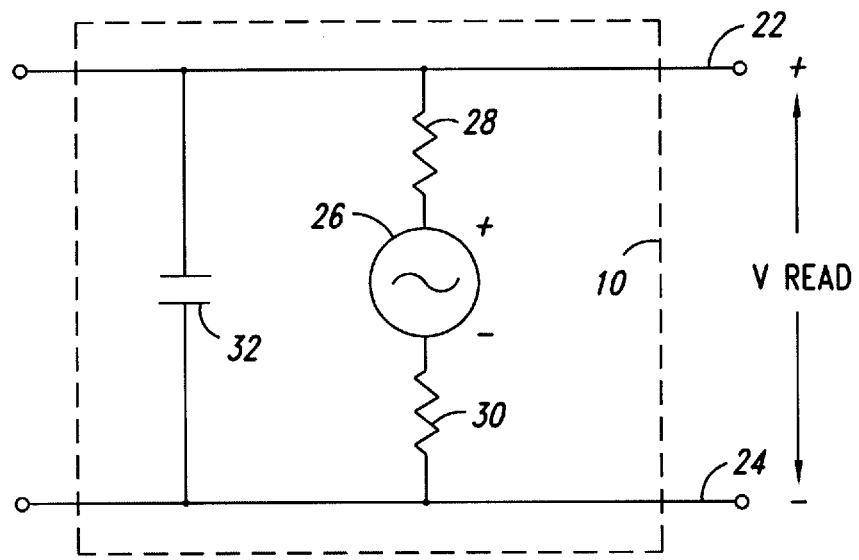
FIG. 2 is a schematic diagram of a conventional circuit model for the read head of FIG. 1.
Figure 4:
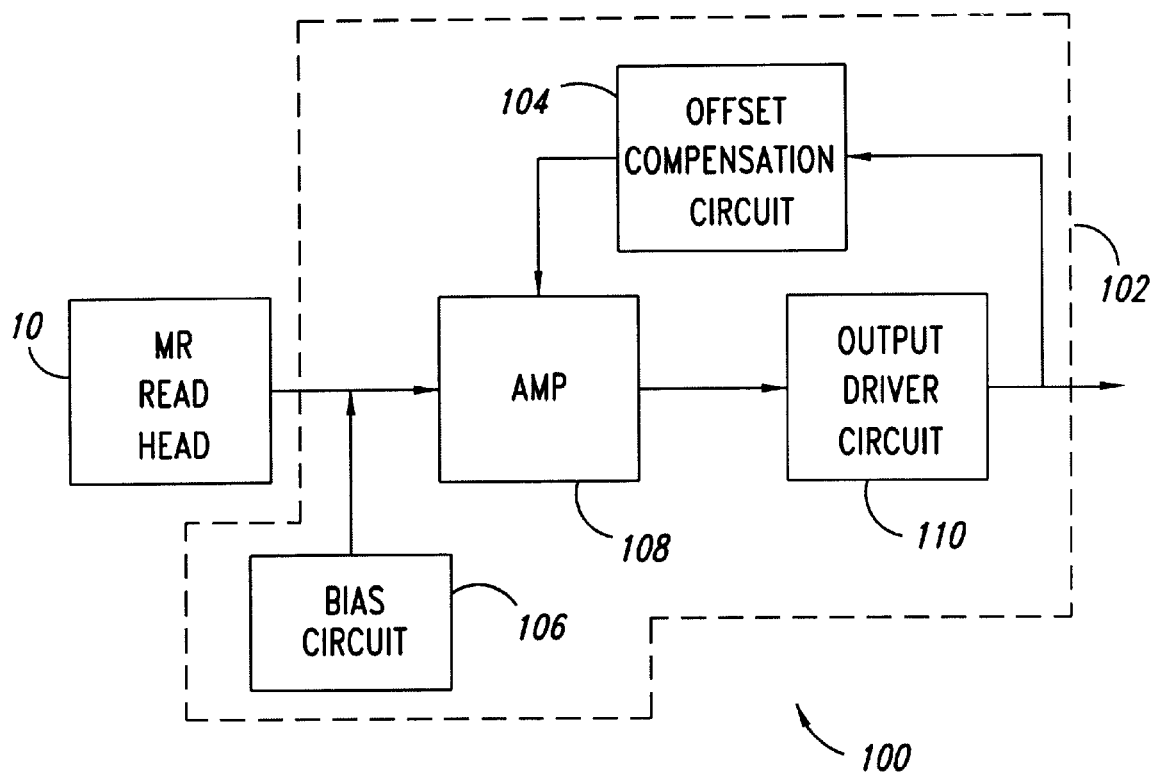
FIG. 4 is a block diagram of a read circuit that includes a preamplifier according to an embodiment of the invention.

FIG. 4 is a block diagram of a read circuit 100, which includes the conventional read head 10 (FIGS. 1–2) and a preamplifier circuit 102 according to an embodiment of the invention. The preamplifier 102 is similar to the preamplifier 12 of FIG. 1 except that instead of using the external capacitor 14, it includes an offset-compensation circuit 104, which can be integrated on the preamplifier die (not shown), and which thus can be internal to the preamplifier 102. The preamplifier 102 also includes a bias circuit 106, an amplifier 108, and an output driver circuit 110. In the embodiment discussed further below in conjunction with FIG. 5, the bias and driver circuits 106 and 110 are respectively similar or identical to the bias and driver circuits 16 and 20 of FIG. 1, and the amplifier 108 is a true differential amplifier.

During steady-state operation the offset-compensation circuit 104 uses feedback to maintain the offset signal at the output of the driver circuit 110 at a predetermined value. Specifically, the circuit 104 senses the value of the offset signal at the output of the driver circuit 110, generates a compensation signal based on the value of this offset signal, and provides the compensation signal to the amplifier 108. In response to the compensation signal, the amplifier 108 generates a steady-state intermediate compensate signal that causes the driver 110 to generate the output offset signal having the predetermined value.

During data-read operation, the preamplifier 102 operates in a true differential manner. Because the manner in which a true differential amplifier operates is well-known, such operation is not discussed in detail.

Figure 3:
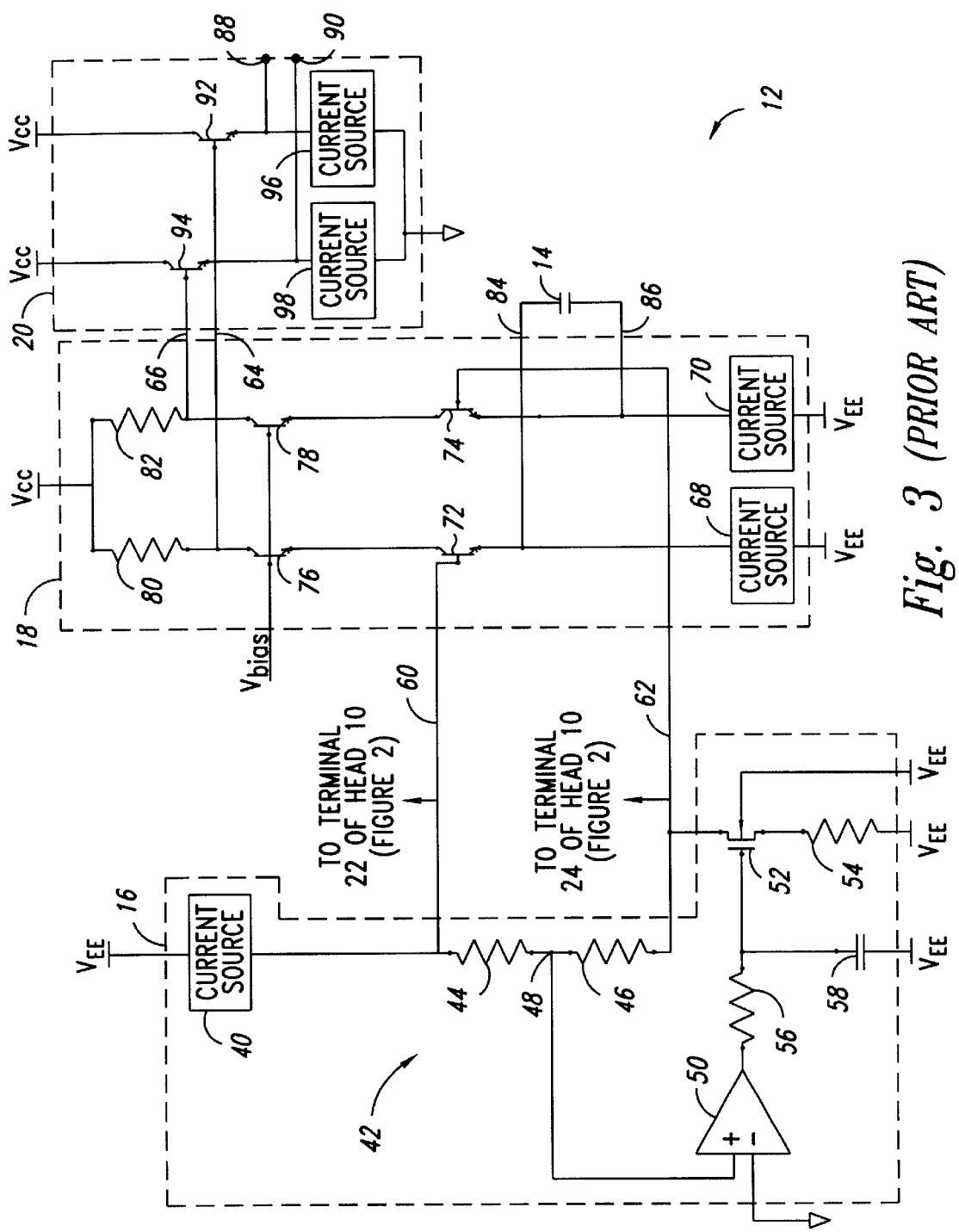
FIG. 3 is a schematic diagram of the conventional preamplifier of FIG. 1.
Figure 5:
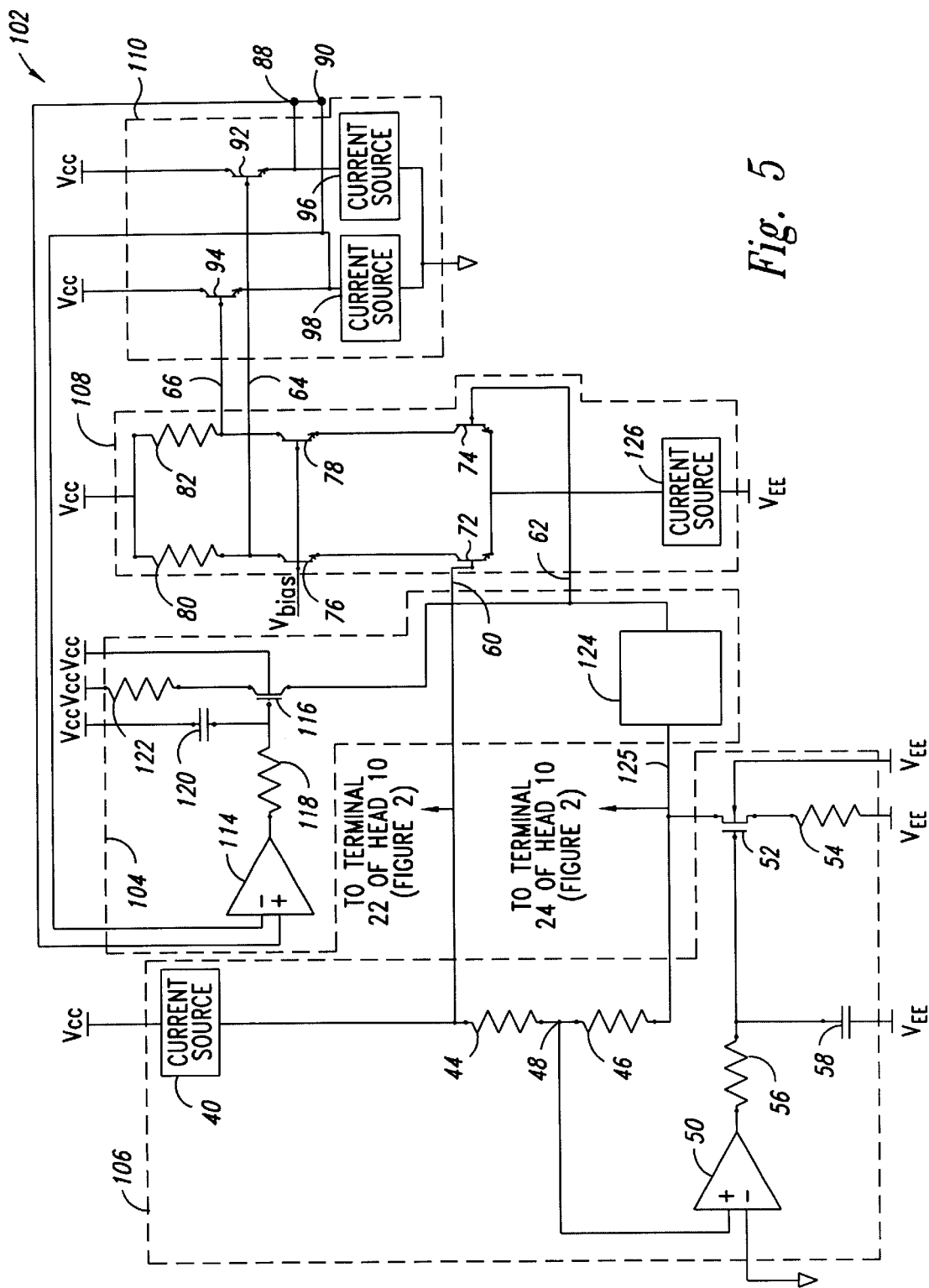
FIG. 5 is a schematic diagram of the preamplifier of FIG. 4 according to an embodiment of the invention.

FIG. 5 is a schematic diagram of the preamplifier circuit 102 of FIG. 4 according to an embodiment of the invention, where like numbers are used to reference components common to the preamplifier circuit 12 of FIG. 3. In this embodiment, the bias circuit 106 is the same as the bias circuit 16, the output driver circuit 110 is the same as the output driver circuit 20, and the amplifier 108 includes many of the same components as the amplifier 18. Therefore, only the differences between the preamplifier 102 and the preamplifier 12 are discussed in detail.

The offset-compensation circuit 104 uses feedback to maintain the offset voltage across the output terminals 88 and 90 at substantially 0 V. The circuit 104 includes a high-gain differential amplifier 114, which compares the voltage on the terminal 88 with the voltage on the terminal 90 and generates a control signal based on the difference between these two voltages. The control signal adjusts the conductivity of a transistor 116, which generates a compensation signal on the input terminal 62 of the amplifier 108. A resistor 118 and a capacitor 120 set the dominant pole of the circuit 104, and a resistor 122 configures the transistor 116 as a common source stage. The circuit 104 also includes a compensation element 124, which is coupled to the head 10 via a terminal 125 and which decouples the compensation signal from the head 10 so that the compensation signal does not alter the bias voltage of the head 10. The compensation element 124 is further discussed below in conjunction with FIGS. 6 and 7. In one embodiment, the amplifier 114 is an operational amplifier, the transistor 116 is a PMOS transistor, the values of the resistors 118 and 122 and the capacitor 120 are approximately 500 KΩ, 2 KΩ, and 20 pF, respectively, the dominant pole is approximately 16 KHz, Vcc=+5 V, and Vee=−5 V. In other embodiments, the dominant pole is in the range of 0 Hz to approximately 100 KHz.

The amplifier 108 is similar to the amplifier 18 (FIG. 3) except that instead of the two current sources 68 and 70, it includes a single current source 126, which is common to both of the input transistors 72 and 74. Therefore, unlike the amplifier 18, the amplifier 108 is a true differential amplifier. Furthermore, because the amplifier 108 includes only one current source, it occupies less die area than the amplifier 18. In one embodiment, the current source 126 generates a current of approximately 6.5 mA.

During steady-state operation, the offset-compensation circuit 104 maintains the offset voltage across the driver output terminals 88 and 90 at approximately 0 V. Because the amplifier 106 is a true differential amplifier, a nonzero input offset voltage across the amplifier input terminals 60 and 62 will generally cause the amplifier 108 to generate a nonzero intermediate offset voltage across the amplifier output terminals 64 and 66, and thus across the driver output terminals 88 and 90. Therefore, the circuit 104 uses feedback to adjust the input offset voltage to a level that causes the amplifier 108 to generate a substantially 0 V intermediate offset voltage.

For example, suppose that the voltage at the terminal 88 is initially higher than the voltage at the terminal 90. The amplifier 114 increases its output voltage, which reduces the amount of current that the transistor 116 sources to the amplifier input terminal 62. This reduction in current reduces the compensation-voltage level at the terminal 62. As a result, the input transistor 74 draws less current through the load 82, and the voltage level at the output terminal 66 increases. This causes the voltage at the drive output terminal 90 to increase. This feedback adjustment continues until the voltage at the terminal 90 substantially equals the voltage at the terminal 88.

Now suppose that the voltage at the terminal 88 is initially lower than the voltage at the terminal 90. The amplifier 114 decreases its output voltage, which increases the level of current that the transistor 116 sources to the amplifier input terminal 62. This increase in current increases the compensation-voltage level at the terminal 62. As a result, the input transistor 74 draws more current through the load 82, and the voltage level at the output terminal 66 decreases. This causes the voltage at the drive output terminal 90 to decrease. This feedback adjustment continues until the voltage at the terminal 90 substantially equals the voltage at the terminal 88.

During data-read operation, the head 10 generates Vread across the amplifier input terminal 60 and the read input terminal 125 of the offset-compensation circuit 104. Because the compensation element 124 does not significantly attenuate Vread, one can approximate that the full value of Vread appears across the amplifier input terminals 60 and 62. Thus, the head 10 superimposes Vread onto the compensation signal from the circuit 104. The amplifier 108 differentially amplifies Vread in a conventional manner to generate the intermediate differential read signal across its output terminals 64 and 66. In response to the intermediate differential read signal, the driver circuit 110 generates the output differential read signal in a conventional manner.

Figure 6:
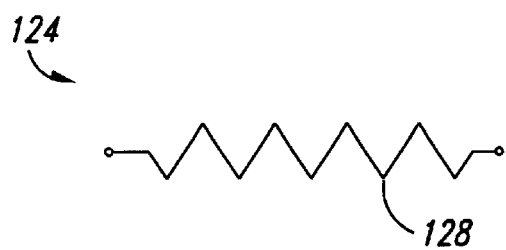
FIG. 6 is a schematic diagram of the compensation element of FIG. 5 according to an embodiment of the invention.

FIG. 6 is a schematic diagram of the compensation element 124 of FIG. 5 according to an embodiment of the invention. In this embodiment, the element 124 is a resistor 128, which in one embodiment has a value of approximately 10Ω. By driving an appropriate current through the resistor 128 with the transistor 116 (FIG. 5), the offset-compensation circuit 104 generates the appropriate offset compensation voltage on the amplifier input terminal 62. Furthermore, the resistor 128 does not significantly attenuate Vread from the read head 10.

Figure 7:
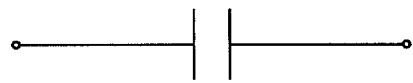
FIG. 7 is a schematic diagram of the compensation element of FIG. 5 according to another embodiment of the invention.

FIG. 7 is a schematic diagram of the compensation element 124 of FIG. 5 according to another embodiment of the invention. In this embodiment, the element 124 is a capacitor 130, which in one embodiment has a value of approximately 100 pF. By charging the capacitor 130 to an appropriate voltage with the transistor 116, (FIG. 5), the offset-compensation circuit 104 generates the appropriate offset-compensation voltage on the amplifier input terminal 62. Unlike the resistor 128 (FIG. 6), the capacitor 130 does not draw a steady-state current from the transistor 116. Therefore, the offset-compensation circuit 104 consumes less power when it includes the capacitor 130 instead of the resistor 128. Additionally, the capacitor 130 typically attenuates Vread less than the resistor 128 does. Furthermore, unlike the external capacitor 14 (FIG. 3), the capacitor 130 is small enough to be integrated on the preamplifier die, and thus is small enough to be internal to the preamplifier circuit 102.

Referring to FIGS. 4–7, other embodiments and variations of the preamplifier circuit 102 are possible in addition to those discussed above. For example, the values of Vcc and Vee can be altered for low-power or single-supply applications. Additionally, the component values can be altered to give the desired frequency responses to the offset compensation circuit 104, the bias circuit 106, the amplifier 108, and the driver circuit 110. Furthermore, MOS transistors can be used in place of bipolar transistors and vice-versa, transistors of one conductivity (e.g. PNP) can be used in place of transistors of the other conductivity (e.g. NPN), and the bias resistors 44 and 46 and the loads 80 and 82 can be active instead of passive. Moreover, the offset-compensation circuit 104 can be designed to monitor the offset voltage across the amplifier output terminals 64 and 66 or to provide the compensation signal to the amplifier input terminal 60 instead or in addition to the amplifier input terminal 62. Additionally, the circuit 104 can be designed to monitor and compensate for offset currents or for use with a single-ended (non-differential) preamplifier circuit.

Figure 8:
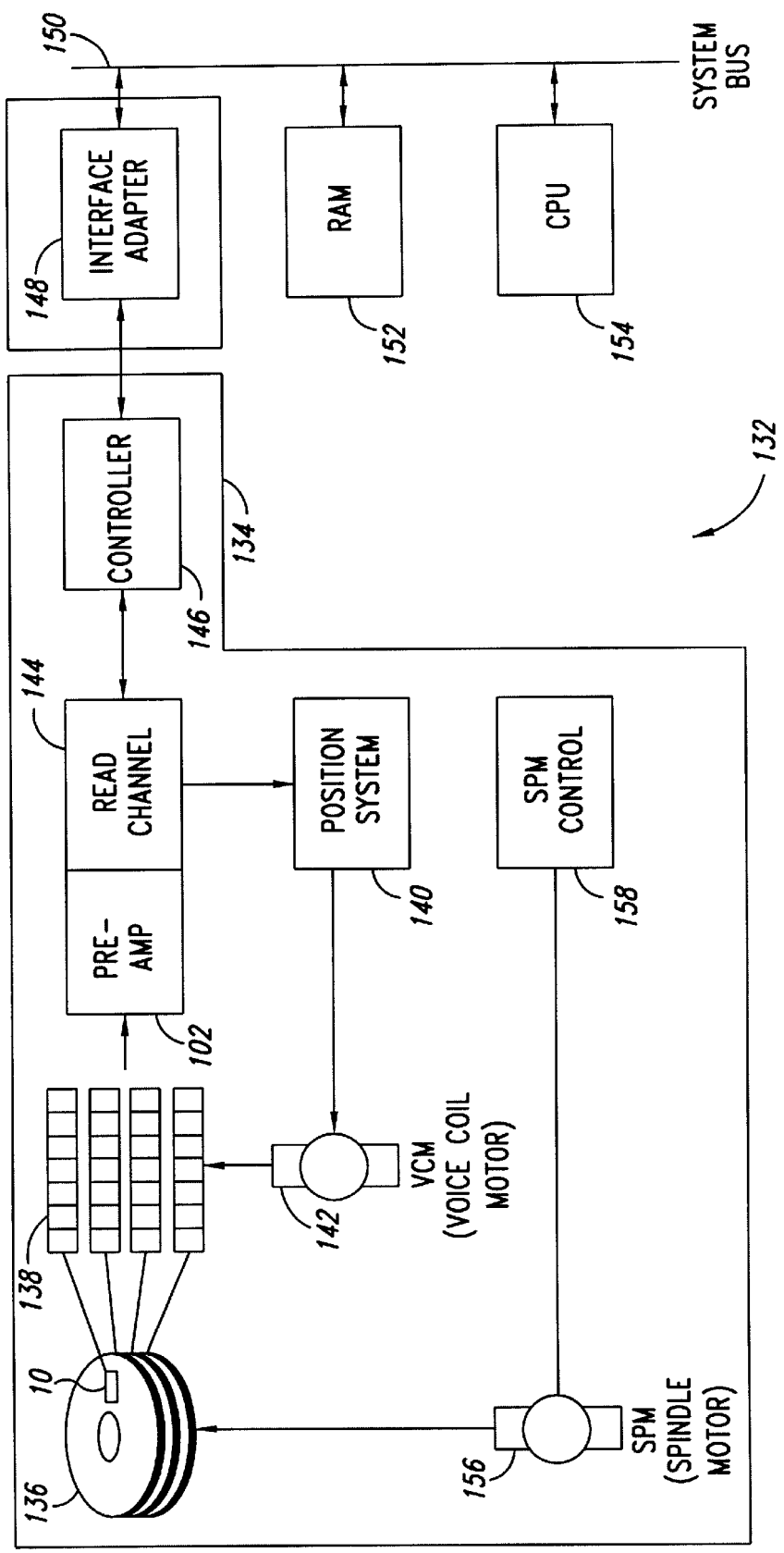
FIG. 8 is a block diagram of a disk-drive system that incorporates the read circuit of FIG. 4.

FIG. 8 is a block diagram of a disk-drive system 132, which includes a disk drive 134. The disk drive 134 includes the read head 10 (FIG. 2) and the preamplifier circuit 102 (e.g., FIGS. 4–5) according to an embodiment of the invention. The disk-drive 134 also includes a storage medium such as one or more disks 136, each of which may contain data on one or both sides. The read head 10 reads the data stored on the disks 136 and is connected to a movable support arm 138. A position system 140 provides a control signal to a voice-coil motor (VCM) 142, which positionally maintains/moves the arm 138 so as to positionally maintain/radially move the head 10 over the desired data on the disks 136.

A read channel 144 detects data in the analog signal, which the channel 144 receives from the head 10 via the preamplifier 102. The channel 144 converts the analog read signal into digital form. A controller 146 recognizes and organizes the digital data from the read channel 144 into bytes of data. An interface adapter 148 provides an interface between the controller 148 and a system bus 150 specific to the system used. Typical system busses include ISA, PCI, S-Bus, Nu-Bus, etc. The host system also typically has other devices, such as a random access memory (RAM) 152 and a central processing unit (CPU) 154 coupled to the bus 150. A spindle motor (SPM) 156 and a SPM control circuit 158 respectively rotate the disk 136 and maintain the disk 136 at the proper rotational speed.

From the foregoing it will be appreciated that, although specific embodiments of the invention have been described herein for purposes of illustration, various modifications may be made without deviating from the spirit and scope of the invention.

What is claimed:

1. A circuit, comprising:

a differential amplifier having first and second amplifier input terminals and having amplifier output terminals, the amplifier operated to respectively receive first and second components of a differential input signal on the first and second amplifier input terminals and to generate a differential offset signal across the amplifier output terminals; and an offset compensator having input terminals respectively coupled to the amplifier output terminals and having on a single compensation terminal, which is coupled to the first amplifier input terminal, the compensator operated to maintain the differential offset signal at a predetermined value by generating an offset-compensation signal on the compensation terminal and superimposing the offset-compensation signal on the first component of the differential input signal.

2. The circuit of claim 1 wherein the predetermined value substantially equals zero.

3. The circuit of claim 1 wherein the first component of the differential input signal is negative with respect to the second component of the differential input signal.

4. A circuit, comprising:

a differential amplifier having first and second amplifier input terminals and having first and second amplifier output terminals, the amplifier operated to respectively receive first and second components of a differential input signal on the first and second amplifier input terminals and to generate a differential output signal across the amplifier output terminals, the differential output signal having an offset component; and an offset compensator having first and second input terminals respectively coupled to the first and second amplifier output terminals and having only one compensation terminal, which is coupled to one of the first and second amplifier input terminals, the compensator operated to maintain the offset component of the differential output signal at a predetermined value by generating an offset-compensation signal on the compensation terminal and superimposing the offset-compensation signal on the respective component of the differential input signal.

5. The circuit of claim 4 wherein the offset compensator comprises:

the compensation terminal being coupled to the first amplifier input terminal;

a third input terminal;

a supply terminal;

a high-gain differential amplifier having an output terminal and having first and second input terminals respectively coupled to the first and second input terminals of the offset compensator;

a transistor coupled between the supply terminal and the compensation terminal, the transistor having a control terminal coupled to the output terminal of the high-gain differential amplifier; and a compensation element coupled between the compensation and third input terminals.

6. The circuit of claim 4 wherein the offset compensator comprises:

the compensation terminal being coupled to the first amplifier input terminal;

a third input terminal;

a supply terminal;

a high-gain differential amplifier having an output terminal and having first and second input terminals respectively coupled to the first and second input terminals of the offset compensator;

a transistor coupled between the supply terminal and the compensation terminal, the transistor having a control terminal coupled to the output terminal of the high-gain differential amplifier; and a compensation resistor coupled between the compensation and third input terminals.

7. A circuit, comprising:
a differential amplifier having first and second amplifier input terminals and having first and second amplifier output terminals, the amplifier operated to respectively receive first and second components of a differential input signal on the first and second amplifier input terminals and to generate a differential output signal across the amplifier output terminals, the differential output signal having an offset component;
an offset compensator having first and second input terminals respectively coupled to the first and second amplifier output terminals and having a compensation terminal coupled to the first amplifier input terminal, the compensator operated to maintain the offset component of the differential output signal at a predetermined value by generating an offset-compensation signal on the compensation terminal and superimposing the offset-compensation signal on the respective component of the differential input signal; and
wherein the offset compensator further comprises,
a third input terminal,
a supply terminal,
a high-gain differential amplifier having an output terminal and having first and second input terminals respectively coupled to the first and second input terminals of the offset compensator,
a transistor coupled between the supply terminal and the compensation terminal, the transistor having a control terminal coupled to the output terminal of the high-gain differential amplifier, and
a compensation capacitor coupled between the compensation and third input terminals.

8. An integrated circuit for amplifying a differential read signal from a read head, the circuit comprising:
an amplifier having a pair of differential amplifier input terminals operable to receive the differential read signal and having a pair of differential amplifier output terminals, the amplifier operable to generate a differential offset signal and a differential amplified read signal across the amplifier output terminals; and
an offset-compensation circuit having a pair of differential-offset input terminals respectively coupled to the amplifier output terminals, a read-signal input terminal, a compensation terminal coupled to one of the amplifier input terminals, and an integrated compensation element coupled to the read-signal input terminal and the compensation terminal, the offset-compensation circuit operable to maintain the offset signal at a predetermined level.

9. An integrated circuit for amplifying a differential read signal from a read head, the circuit comprising:
first and second circuit input terminals operable to differentially receive the read signal;
a differential amplifier having a first amplifier input terminal coupled to the first circuit input terminal, a second amplifier input terminal, and first and second amplifier output terminals, the amplifier operable to generate an offset signal and an amplified read signal on the first and second amplifier output terminals; and
a offset compensation circuit having first and second input terminals respectively coupled to the first and second amplifier output terminals, a third input terminal coupled to the second circuit input terminal, a compensation terminal coupled to the second amplifier input terminal, and a single and only a single compensation element, which is coupled between the compensation terminal and the third input terminal, the offset-compensation circuit operable to maintain the offset signal at a predetermined level.

10. A circuit for amplifying a differential read signal from a read head, the circuit comprising:
a differential amplifier having first and second amplifier input terminals operable to receive the differential read signal and having first and second amplifier output terminals; and
an offset compensation circuit having first and second input terminals respectively coupled to the first and second amplifier output terminals, a third input terminal, a compensation terminal coupled to the first amplifier input terminal, and a single and only a single compensation element, which is coupled between the third input terminal and the compensation terminal.

11. A circuit for amplifying a differential read signal from a read head, the circuit comprising:
a differential amplifier having first and second amplifier input terminals operable to receive the differential read signal and having first and second amplifier output terminals;
an offset compensation circuit having first and second input terminals respectively coupled to the first and second amplifier output terminals, a third input terminal, a compensation terminal coupled to the first amplifier input terminal, and a compensation element coupled between the third input terminal and the compensation terminal; and
a driver circuit having first and second driver input terminals respectively coupled to the first and second amplifier output terminals and having first and second driver output terminals.

12. A read circuit, comprising:
a read head having first and second read-head output terminals and operable to sense data and to generate a read signal across the output terminals based on the sensed data;
an amplifier having a first amplifier input terminal coupled to the first read-head output terminal, a second amplifier input terminal, and first and second amplifier output terminals, the amplifier operable to generate an offset signal and an amplified read signal across the amplifier output terminals; and
an offset compensation circuit having first and second input terminals respectively coupled to the first and second amplifier output terminals, a third input terminal coupled to the second read-head output terminal, a compensation terminal coupled to the second amplifier input terminal, and a compensation element coupled to the third input terminal and the compensation terminal, the compensation circuit operable to maintain the offset signal at a predetermined level.

13. The read circuit of claim 12 wherein the read head comprises a magneto-resistive read head.

14. The read circuit of claim 12, further comprising a bias circuit coupled to the read head.

15. The read circuit of claim 12, further comprising a driver circuit having first and second driver input terminals respectively coupled to the first and second amplifier output terminals and having first and second driver output terminals.

16. The read circuit of claim 12 wherein the offset signal comprises a low-frequency signal.

17. The circuit of claim 14 wherein the differential offset-compensation circuit is operable to superimpose an offset-compensation signal onto the read signal.

18. A read circuit, comprising:
a read head having first and second data terminals;
an amplifier having first and second amplifier input terminals, the first amplifier input terminal coupled to the first data terminal, the amplifier also having a pair of amplifier output terminals; and
an offset compensation circuit having a pair of input terminals respectively coupled to the amplifier output terminals, a data input terminal coupled to the second data terminal, a compensation terminal coupled to the second amplifier input terminal, and a compensation element coupled between the data input terminal and the compensation terminal.

19. The read circuit of claim 18, further comprising a bias circuit having a bias terminal coupled to the read head.

20. The read circuit of claim 18, further comprising a driver circuit having first and second driver input terminals respectively coupled to the first and second amplifier output terminals and having first and second driver output terminals.

21. A circuit for amplifying a differential read signal generated by a read head, the circuit comprising:
a differential amplifier having amplifier input terminals operable to receive the differential read signal from the read head and having amplifier output terminals, the amplifier operable to generate a differential offset signal and an amplified differential read signal on the amplifier output terminals; and
a differential offset compensation circuit having input terminals respectively coupled to the amplifier output terminals, a compensation input terminal operable to receive a portion of the differential read signal, a compensation output terminal coupled to one of the amplifier input terminals, and a compensation capacitor coupled between the compensation input and compensation output terminals, the compensation circuit operable to maintain the differential offset signal at a predetermined level.

22. The circuit of claim 21, further comprising a differential bias, circuit for biasing the read head.

23. The circuit of claim 21, further comprising a differential driver circuit having driver input terminals respectively coupled to the amplifier output terminals and having driver output terminals.

24. The circuit of claim 21 wherein the differential offset signal comprises a substantially zero-frequency signal.

25. The circuit of claim 21 wherein the differential offset-compensation circuit is operable to generate an offset-compensation signal on the compensation terminal.

26. A circuit for amplifying a differential read signal generated by read head, the circuit comprising:
a differential amplifier having a first and second read-signal amplifier input terminals and having first and second amplifier output terminals; and
a differential offset-compensation circuit having first and second offset input terminals respectively coupled to the first and second amplifier output terminals, a read-signal input terminal, a compensation terminal coupled to the first read-signal amplifier input terminal of the differential amplifier, and a compensation capacitor coupled between the read-signal input terminal and compensation terminal.

27. The circuit of claim 26, further comprising a bias circuit that includes:
first and second supply terminals;
first and second bias terminals respectively coupled and to the second read-signal amplifier input terminal of the differential amplifier and to the read-signal input terminal of the differential offset-compensation circuit;
a sense node;
a reference node;
a current source coupled between the first supply and the first bias terminals;
a first bias element coupled between the first bias terminal and the sense node;
a second bias element coupled between the second bias terminal and the sense node;
a high-gain differential amplifier having a first input terminal coupled to the sense node, a second input terminal coupled to the reference node, and an output terminal; and
a transistor coupled between the second bias and second supply terminals and having a control terminal coupled to the output terminal of the high-gain differential amplifier.

28. The circuit of claim 26, further comprising a bias circuit that includes:
first and second supply terminals;
first and second bias terminals respectively coupled and to the second read-signal amplifier input terminal of the differential amplifier and to the read-signal input terminal of the differential offset-compensation circuit;
a sense node;
a reference node;
a current source coupled between the first supply and the first bias terminals;
a first bias element coupled between the first bias terminal and the sense node;
a second bias element coupled between the second bias terminal and the sense node;
a high-gain differential amplifier having a first input terminal coupled to the sense node, a second input terminal coupled to the reference node, and an output terminal;
a resistor having a first terminal coupled to the output terminal of the high-gain differential amplifier and having a second terminal;
a capacitor having a first terminal coupled to the second terminal of the resistor and having a second terminal coupled to the second supply terminal; and
a transistor coupled between the second bias and second supply terminals and having a control terminal coupled to the first terminal of the capacitor.

29. The circuit of claim 26, further comprising a differential driver circuit that is coupled between the differential amplifier and the differential offset-compensation circuit, the differential driver circuit comprising:
a supply terminal;
first and second driver input terminals respectively coupled to the amplifier output terminals;
first and second driver output terminals respectively coupled to the first and second offset input terminals of the differential offset-compensation circuit;
a first transistor having a first terminal coupled to the supply terminal, a second terminal coupled to the first driver output terminal, and a control terminal coupled the first driver input terminal; and
a second transistor having a first terminal coupled to the supply terminal, a second terminal coupled to the second driver output terminal, and a control terminal coupled the second driver input terminal.

30. The read circuit of claim 26, further comprising a differential driver circuit that is coupled between the differential amplifier and the differential offset compensation circuit, the differential driver circuit comprising:
  first and second supply terminals;
  first and second driver input terminals respectively coupled to the amplifier output terminals;
  first and second driver output terminals respectively coupled to the first and second offset input terminals of the compensation circuit;
  a first transistor having a first terminal coupled to the first supply terminal, a second terminal coupled to the first driver output terminal, and a control terminal coupled to the first driver input terminal;
  a second transistor having a first terminal coupled to the first supply terminal, a second terminal coupled to the second driver output terminal, and a control terminal coupled the second driver input terminal;
  a first current source coupled between the first driver output and second supply terminals; and
  a second current source coupled between the second driver output and second supply terminals.

31. The circuit of claim 26 wherein the differential amplifier comprises:
  first and second supply terminals;
  a first load coupled between the first supply terminal and the first amplifier output terminal;
  a second load coupled between the first supply terminal and the second amplifier output terminal;
  a first transistor having a first terminal coupled to the first amplifier output terminal, a second terminal, and a control terminal coupled to the first read-signal amplifier input terminal;
  a second transistor having a first terminal coupled to the second amplifier output terminal, a second terminal, and a control terminal coupled to the second read-signal amplifier input terminal; and
  a current source having a first terminal coupled to the second terminals of the first and second transistors and having a second terminal coupled to the second supply terminal.

32. The circuit of claim 26 wherein the differential amplifier comprises:
  first and second supply terminals;
  a bias node;
  a first load coupled between the first supply terminal and the first amplifier output terminal;
  a second load coupled between the first supply terminal and the second amplifier output terminal;
  a first transistor having a first terminal coupled to the first amplifier output terminal, a second terminal, and a control terminal coupled to the bias node;
  a second transistor having a first terminal coupled to the second amplifier output terminal, a second terminal, and a control terminal coupled to the bias node;
  a third transistor having a first terminal coupled to the second terminal of the first transistor, a second terminal, and a control terminal coupled to the first read-signal amplifier input terminal;
  a fourth transistor having a first terminal coupled to the second terminal of the second transistor, a second terminal, and a control terminal coupled to the second read-signal amplifier input terminal; and
  a current source having a first terminal coupled to the second terminals of the third and fourth transistors and having a second terminal coupled to the second supply terminal.

33. The circuit of claim 26 wherein the offset-compensation circuit further comprises:
  a supply terminal;
  a high-gain differential amplifier having an output terminal and having first and second input terminals respectively coupled to the first and second offset input terminals of the offset-compensation circuit; and
  a transistor coupled between the supply terminal and the compensation terminal, the transistor having a control terminal coupled to the output terminal of the high-gain differential amplifier.

34. The circuit of claim 26 wherein the offset-compensation circuit is integrated on a die and further comprises:
  a supply terminal;
  a high-gain differential amplifier having an output terminal and having first and second input terminals respectively coupled to the first and second offset input terminals of the offset-compensation circuit;
  a resistor having a first terminal coupled to the output terminal of the high-gain differential amplifier and having a second terminal;
  a capacitor coupled between the supply terminal and the second terminal of the resistor;
  a transistor coupled between the supply terminal and the second compensation terminal, the transistor having a control terminal coupled to the second terminal of the resistor; and
  wherein the compensation capacitor is integrated on the die.

35. A disk-drive system, comprising:
  a data-storage disk having a surface;
  a motor coupled to and operable to rotate the disk;
  a read head operable to sense data stored on the disk and to generate a read signal based on the sensed data;
  a read-head positioning assembly operable to move the read head over the surface of the disk; and
  a pre-amplifier circuit coupled to the read head, the circuit comprising:
    differential amplifier having a first amplifier input terminal coupled to the read head, a second amplifier input terminal, and first and second amplifier output terminals, the amplifier operable to generate an offset signal and an amplified read signal on the amplifier output terminals; and
    an offset compensation circuit having first and second input terminals respectively coupled to the amplifier output terminals, a third input terminal coupled to the read head, a compensation output terminal coupled to the second amplifier input terminal, and a compensation element coupled between the third input terminal and the compensation output terminal, the compensation circuit operable to maintain the offset signal at a predetermined level.

36. A method, comprising:
  generating a compensation signal based on the level of a steady-state differential output signal from a differential amplifier having first and second input terminals;
  coupling the compensation signal to the second input terminal of the amplifier to maintain the level of the steady-state output signal within a predetermined range;

coupling a first portion of a read signal to the first input terminal of the amplifier;

filtering a second portion of the read signal; and coupling the filtered second portion of the read signal to the second input terminal of the amplifier.

37. The method of claim 36 wherein coupling the compensation signal comprises coupling the compensation signal to the second input terminal of the amplifier to maintain the level of the output signal at approximately zero.

38. The method of claim 36 wherein coupling the compensation signal comprises superimposing the compensation signal onto the filtered second portion of the read signal at the second input terminal of the differential amplifier.

39. A method, comprising:

generating a compensation signal based on the levels of first and second low-frequency output signals from a differential amplifier having first and second input terminals;

coupling the compensation signal to the second input terminal of the amplifier to maintain the level of the first output signal substantially equal to the level of the second output signal;

receiving a first portion of a differential read signal with the first input terminal of the amplifier;

filtering a second portion of the differential read signal; and receiving the second portion of the differential read signal with the second input terminal of the amplifier.

40. A method, comprising;

generating a read-head bias signal;

coupling the bias signal directly to a first input terminal of a differential amplifier;

coupling the bias signal through a compensation element to a second input terminal of the differential amplifier:

generating a differential offset signal on output terminals of the differential amplifier in response to the bias signal;

generating an offset-compensation signal in response to the offset signal; and superimposing the offset-compensation signal on the bias signal by coupling the offset-compensation signal to the second input terminal of the differential amplifier.

41. The method of claim 40, further comprising maintaining a difference between a first signal level on a first one of the amplifier output terminals and a second signal level on a second one of the amplifier output terminals substantially at a predetermined value in response to the offset-compensation signal.

42. The method of claim 40, further comprising maintaining a first signal level on a first one of the amplifier output terminals substantially equal to a second signal level on a second one of the amplifier output terminals in response to the offset-compensation signal.

43. A method, comprising;

generating a differential read-head bias signal having first and second portions;

coupling the first portion of the bias signal directly to a first input terminal of a differential amplifier that is disposed on a semiconductor die;

coupling the second portion of the bias signal to a second input terminal of the differential amplifier through a compensation element disposed on the semiconductor die;

generating a differential offset signal on output terminals of the differential amplifier in response to the bias signal;

generating an offset-compensation signal in response to the differential offset signal; and compensating for the differential offset signal by coupling the offset-compensation signal to the second input terminal of the differential amplifier.

44. The method of claim 43 wherein the compensation element comprises a capacitor.

45. The method of claim 43 wherein the compensation element comprises a resistor.

* * * * *